United States Patent
Ganusov et al.

(10) Patent No.: US 9,954,534 B2
(45) Date of Patent: Apr. 24, 2018

(54) METHODS AND CIRCUITS FOR PREVENTING HOLD TIME VIOLATIONS

(71) Applicant: Xilinx, Inc., San Jose, CA (US)

(72) Inventors: Ilya K. Ganusov, San Jose, CA (US); Benjamin S. Devlin, New York, NY (US); Henri Fraisse, Sunnyvale, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/267,880

(22) Filed: Sep. 16, 2016

(65) Prior Publication Data
US 2018/0083633 A1 Mar. 22, 2018

(51) Int. Cl.
| H03K 19/177 | (2006.01) |
| H01L 25/00 | (2006.01) |
| H03K 3/037 | (2006.01) |
| G06F 17/50 | (2006.01) |

(52) U.S. Cl.
CPC ..... *H03K 19/1776* (2013.01); *G06F 17/5072* (2013.01); *G06F 17/5077* (2013.01); *H03K 3/0372* (2013.01); *H03K 19/17728* (2013.01)

(58) Field of Classification Search
None
See application file for complete search history.

(56) References Cited

U.S. PATENT DOCUMENTS

| 9,385,696 | B1 * | 7/2016 | Jangity | H03K 5/05 |
| 2003/0159118 | A1 * | 8/2003 | Lindkvist | G06F 17/505 716/108 |
| 2013/0222029 | A1 * | 8/2013 | Bowers | G06F 9/3869 327/198 |

OTHER PUBLICATIONS

U.S. Appl. No. 15/234,640, filed Aug. 11, 2016, Ganusov, Ilya K. et al., Xilinx, Inc., San Jose, CA USA.
U.S. Appl. No. 15/267,572, filed Sep. 16, 2016, Ganusov, Ilya K. et al., Xilinx, Inc., San Jose, CA USA.
Ganusov, Ilya et al., "Time-borrowing platform in the Xilinx UltraScale+ family of FPGAs and MPSoCs", 9 pp.; Proceedings of the 26th International Conference on Field-Programmable Logic and Applications, SwissTech Convention Center, Lausanne, Switzerland, Aug. 29-Sep. 2, 2016, 9 pages.

* cited by examiner

*Primary Examiner* — Anh Tran
(74) *Attorney, Agent, or Firm* — LeRoy D. Mauna

(57) ABSTRACT

Aspects of various embodiments of the present disclosure are directed to methods and circuits for preventing hold time violations in clock synchronized circuits. In an example implementation, a circuit includes at least a first flip-flop, a second flip-flop, and a level-sensitive latch connected in a signal path from the first flip-flop to the second flip-flop. A clock node of the first flip-flop is connected to receive a first clock signal and a clock node of the second flip-flop is connected to receive a second clock signal. The propagation delay from the first flip-flop through the level-sensitive latch to the second flip-flop is smaller than the skew between the first clock and the second clock, thereby presenting a hold time violation. A level-sensitive latch control circuit is configured to prevent the hold time violation by providing a pulsed clock signal to a clock node of the one level-sensitive latch circuit.

10 Claims, 6 Drawing Sheets

METHODS AND CIRCUITS FOR PREVENTING HOLD TIME VIOLATIONS

FIELD OF THE INVENTION

The disclosure generally relates to electronic circuits, and more particularly to methods and structures for preventing hold time violations in electronic circuits.

BACKGROUND

Modern digital circuits, whether implemented in integrated circuits (IC) or in discrete form, often utilize latches to synchronize propagation of data signals. One type of latch, referred to as a level-sensitive latch, provides an output signal having a state that depends upon the activity of the dock signal that is present at a dock input node. In particular, the logic value of the output signal of the level-sensitive latch reflects the logic value of the signal at the input node during a portion of the input dock cycle. In this phase of operation, the latch passes a logic value present at its input node directly to its output node. A latch operating in this phase may be referred to as being transparent. In a second phase of operation, the level-sensitive latch maintains the output signal at a fixed logic value during the remaining portion of the input clock cycle, regardless of the logic value present at the input node. A latch operating in the second phase may be referred to as being latched or held.

Another type of latch, referred to as a flip-flop or edge-triggered latch, is configured to set and hold an output signal to a logic value present at an input node during an edge of a clock signal provided to a clock input node. One implementation of a flip-flop includes a combination of two level-sensitive latches. The first level-sensitive latch, i.e., the master stage, is transparent during a first phase of the input clock, while the second level-sensitive latch, i.e., the slave stage, is transparent during a second phase of the input clock. The combined behavior is such that the input data is captured and passed to the output node only when the clock signal exhibits a low-to-high logic transition. The value of the output signal is maintained until the next low-to-high transition of the clock signal. Conversely, the configuration of the two level-sensitive latches may be altered to capture input data during a high-to-low logic transition of the clock signal.

SUMMARY

Various example implementations are directed to circuits and methods for preventing hold time violations in dock synchronized circuits. In an example implementation, a circuit includes at least a first flip-flop, a second flip-flop, and a level-sensitive latch connected in a first signal path from the first flip-flop to the second flip-flop. A clocking distribution circuit provides a first clock signal to a clock node of the first flip-flop and provides a second clock signal to a clock node of the second flip-flop. The propagation delay from the first flip-flop through the level-sensitive latch to the second flip-flop is smaller than the skew between the first clock and the second clock, thereby presenting a hold time violation. A level-sensitive latch control circuit is configured to prevent the hold time violation by providing a pulsed clock signal to a clock node of the one level-sensitive latch circuit.

In another example implementation, an integrated circuit includes a set of programmable logic resources including a plurality of flip-flops. The integrated circuit also includes a set of programmable routing resources having level-sensitive latches in respective programmable signal paths. A configuration circuit is configured to, in response to receiving a set of configuration data, program the programmable logic resources and the set of programmable routing resources to implement a circuit design. The circuit design includes a first one of the flip-flops clocked by a first clock, a second flip-flop clocked by a second clock, and one of the level-sensitive latches in a signal path connecting an output of the first one of the flip-flops to a second one of the flip-flops. The propagation delay from the first flip-flop through the level-sensitive latch to the second flip-flop is smaller than the skew between the first clock and the second clock, thereby presenting a hold time violation. The integrated circuit also includes a level-sensitive latch control circuit configured to prevent the hold time violation by enabling clocking of the one of the level-sensitive latches with a pulsed clock signal.

In yet another embodiment, a method is provided for placement and routing of a circuit design. A placed-and-routed circuit design is generated by determining a placement for circuit elements of the circuit design and determining a set of routes between the circuit elements for connections specified in the circuit design. Timing of the determined set of routes is evaluated to identify signal paths that present a hold time violation to a flip-flop in the placed-and-routed circuit design. In response to identifying a signal path presenting a hold time violation, the hold time violation is prevented by enabling clocking of a level-sensitive latch connected in the identified signal path with a pulsed clock signal.

Other features will be recognized from consideration of the Detailed Description and Claims, which follow.

BRIEF DESCRIPTION OF THE DRAWINGS

Various aspects and features of the circuits and methods will become apparent upon review of the following detailed description and upon reference to the drawings in which.

DETAILED DESCRIPTION

Figure 1:
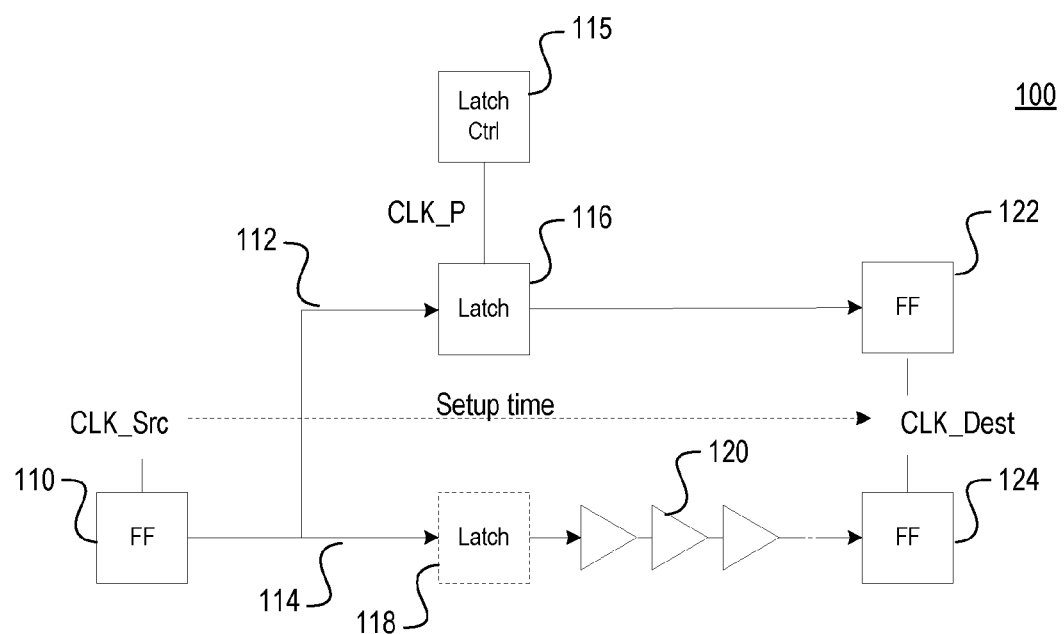
FIG. 1 shows a diagram of an example circuit configured to prevent hold time violations, consistent with one or more implementations.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

Compliance with required setup and hold times is one consideration in the design of electronic circuits. The setup time for a docked circuit element (e.g., a flip-flop, a latch, a register, a lookup table in RAM mode or shift register mode, or other docked element) is the minimum length of time that a data signal must be available and stable at an input terminal of the circuit element before a leading edge of a dock pulse is applied to a dock input terminal of the circuit element. If the clock pulse is applied too soon after the data signal, the setup time will be violated (less than the minimum length of time) and the docked element may output an incorrect signal. Hold time for the docked circuit element is the minimum amount of time a data signal must be stable after the leading dock edge is applied to a dock input terminal. If an input signal is not held stable at the input for the required time following the leading clock edge, the hold time will be violated. If either a set-up or hold time requirement is violated, the circuit element may not operate correctly.

Some design approaches remove hold time violations by rerouting a signal path to increase the time needed to propagate the signals to the input terminals subject to the hold time violations. However, rerouting signal paths can be difficult in congested areas where area and/or routing resources may be limited. Methods and circuits are disclosed for removing hold time violations without rerouting signal paths.

In some example implementations, hold time violations are removed using pulsed clocking of level-sensitive latches in signal paths presenting the hold time violations. In an example implementation, a circuit includes at least a first flip-flop, a second flip-flop, and a level-sensitive latch connected in a first signal path from the first flip-flop to the second flip-flop. The first flip-flop is clocked with a first clock signal and the second flip-flop is clocked with a second clock signal. The propagation delay from the first flip-flop through the level-sensitive latch to the second flip-flop is smaller than the skew between the first clock and the second clock, thereby presenting a hold time violation. The hold time violation is prevented by providing a phase-shifted pulsed clock signal to a clock node of the one level-sensitive latch circuit.

As described in more detail with reference to the figures, clocking of the level-sensitive latch with a phase-shifted pulsed clock signal allows the signal to be latched and presented to an input of the second flip-flop for a longer period of time. In this manner, the hold time violation is prevented.

Turning now to the figures, FIG. 1 illustrates use of pulsed latches in an example circuit to prevent hold time violations. The example circuit 100 includes a set of source flip-flops 110 that is synchronized by a first clock signal CLK_Src and a set of destination flip-flops 122 and 124 that are synchronized by a second clock signal CLK_Dest and are configured to receive signals output by the set of source flip-flops. In this example, the circuit includes one source flip-flop 110 and two destination flip-flops. In some implementations, the circuit 100 may be adapted to include additional source flip-flops clocked by the first clock signal CLK_Src and/or to include additional or fewer destination flip-flops. For example, the circuit may be adapted to include two source flip-flops in the fan-in of an input to a single destination flip-flop.

To ensure correct operation, the signals generated by source flip-flop 110 must be present on the inputs of destination flip-flops 122 and 124 when the CLK_Dest clock triggers the destination flip-flops to latch the values of the signals. In this example, the signal path 114 between the source flip-flop 110 and destination flip-flop 124 includes a number of logic circuits 120, which causes propagation time of the signal path 114 to be greater than the propagation time of the signal path 112 from flip-flop 110 to destination flip-flop 122. For ease of reference, a signal path having a longest propagation time to the logic circuit may be referred to as a setup path. A signal path having the least propagation time to the logic circuit, and which may present a hold time violation, may be referred to as a hold path. Depending on the propagation delays, the CLK_Dest clock signal may be adjusted (e.g., phase-shifted) so a rising edge occurs at a time in which the correct signals are present on both of the destination flip-flops 122 and 124. If the difference in propagation times is too great, the signal communicated via signal path 112 will not be present at a time when the signal communicated via signal path 114 is presented to destination flip-flop 124. As a result a hold time violation is present.

The circuit 100 includes a level-sensitive latch 116 in the hold path 112 for prevention of the hold time violation. As described in more detail with reference to FIG. 2, the level-sensitive latch 116 is clocked with a phase-shifted pulsed clock signal CLK_P by a latch control circuit 115, which causes the level-sensitive latch 116 to delay the signal provided to flip-flop 122 for an amount of time sufficient to satisfy the hold time requirements. In this manner, the hold time violation is prevented.

In some implementations, the circuit may include level-sensitive latches 116 and 118 in a number of signal paths which may or may not exhibit hold time violations. If a hold time violation is later discovered (e.g., during simulation and/or testing), the hold time violation may be removed by enabling clocking of a level-sensitive latch in the hold path with a phase-shifted pulsed clock signal. Level-sensitive latches in signal paths that do not present hold time violations (e.g., latch 118) are operated in a transparent state, for example, by providing a constant signal (e.g., logic 1) to a clock input node of the latch.

Figure 2:
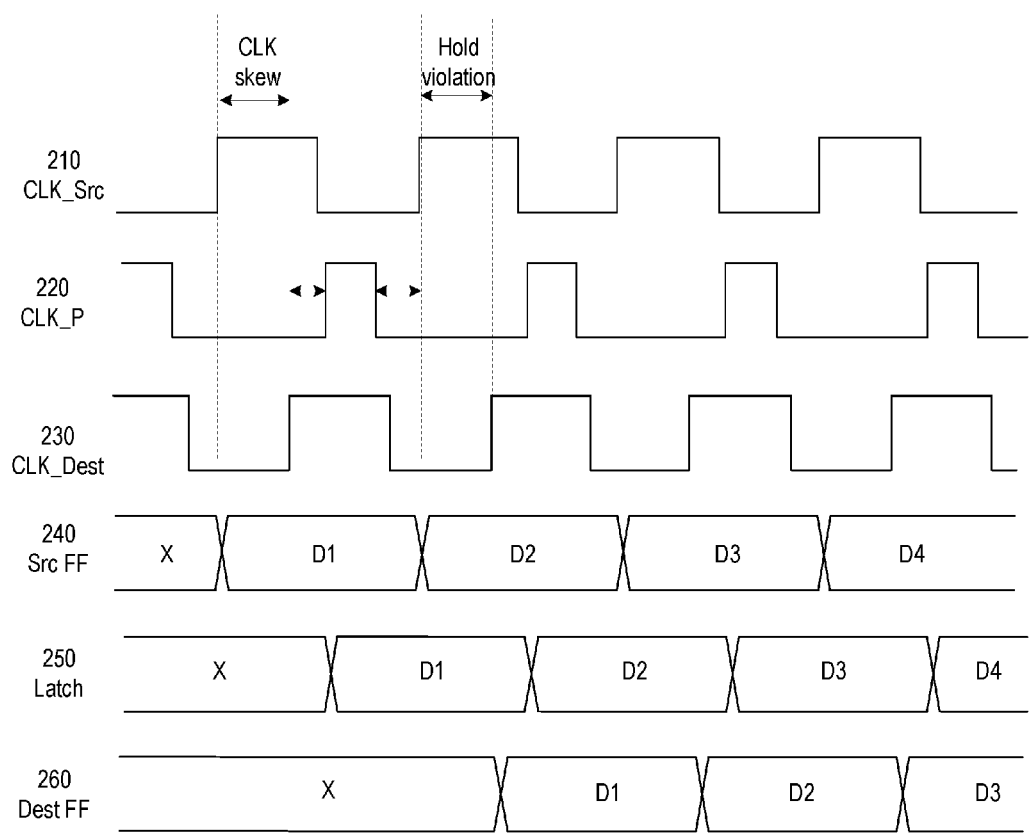
FIG. 2 shows waveforms for an example set of signals generated during operation of the circuit shown in FIG. 1, consistent with one or more implementations.

FIG. 2 shows waveforms for an example set of signals generated during operation of the circuit shown in FIG. 1, consistent with one or more implementations. Waveform 210 shows an example clock CLK_Src used for clocking of source flip-flop(s) (e.g., 114 in the circuit shown in FIG. 1). Waveform 230 shows an example clock CLK_Dest used for clocking of destination flip-flop(s) (e.g., 122 and 124) having the source flip-flop(s) in their respective fan-in cones. Waveform 220 shows a phase-shifted pulsed clock signal CLK_P used to clock the level-sensitive latch 148. The phase-shifted pulsed clock signal CLK_P has a rising edge aligned with or following a rising edge of CLK_Dest and has a falling edge prior to a rising edge of CLK_Src.

Waveform 240 shows signal values transmitted on the signal path by source flip-flop to a destination flip-flop during operation. Waveform 250 shows signal values output by a latch in the signal path and clocked by the phase-shifted pulsed clock signal CLK_P. Waveform 260 shows signal values output by the destination flip-flop having an input connected to receive the signal shown in waveform 250 and clocked by the clock signal CLK_Dest. Waveforms 240, 250, and 260 are labeled to indicate the respective clock cycle in which each portion of the signals are transmitted on the hold path (e.g., from source flip-flops 114 to destination flip-flop 122). For instance, D1 indicates the signals transmitted in a first clock cycle and D2 indicates the signals transmitted in a second clock cycle.

In this example, the CLK_Dest is delayed by a period of time (CLK skew) relative to the source clock CLK_Src. In some instances, the delay may be an unintentional delay introduced by propagation delay on a clock distribution network. In some other instances, the CLK_Dest clock may be intentionally delayed to resolve a setup path violation on another signal path. As a result of the delayed CLK_Dest clock, the signal value D1 in waveform 240 is not available when the rising edge of CLK_Dest triggers the destination flip-flop to sample and hold the signal value transmitted on the signal path in the next clock cycle—thereby presenting a hold time violation. Clocking of the level-sensitive latch in the signal path allows the signal value D1 to be delayed until a later time as shown in waveform 250. As a result, the destination latch is able to latch the signal value D1 at the rising edge of the delayed CLK_Dest clock. In this manner, the hold time violation is prevented.

The location and duration of pulses in the phase-shifted pulsed clock CLK_P may vary in different implementations. In some implementations, the phase-shifted pulsed clock CLK_P is configured to have a rising edge located at a time following the rising edge of the CLK_Dest clock. This prevents the destination latch from incorrectly latching the signal value in an earlier clock cycle than intended. The phase-shifted pulsed clock CLK_P is also configured to have a falling edge at a time prior to the next rising edge of the source clock CLK_Src. This ensures that the signal value is latched before the value of the source flip-flop changes on the next cycle of CLK_Src. In other implementations the phase-shifted pulsed clock may be an inversion of CLK_Src.

The circuits and methods may be adapted for avoiding hold time violations in a number of applications. The circuits and methods are thought to be particularly applicable for use in integrated circuits (ICs) having programmable circuitry (e.g., programmable ICs or System-on-chips), which may be programmed for various circuit arrangements. In this context, the disclosed methods and circuits may enable easier removal of hold time violations in a circuit design without rerouting signal paths. A programmable IC may include a plurality of configurable logic blocks and a set of programmable routing resources providing programmable signal paths between the configurable logic blocks with level-sensitive latches that may be used to prevent hold time violations as described with reference to FIGS. 1 and 2.

Figure 3:
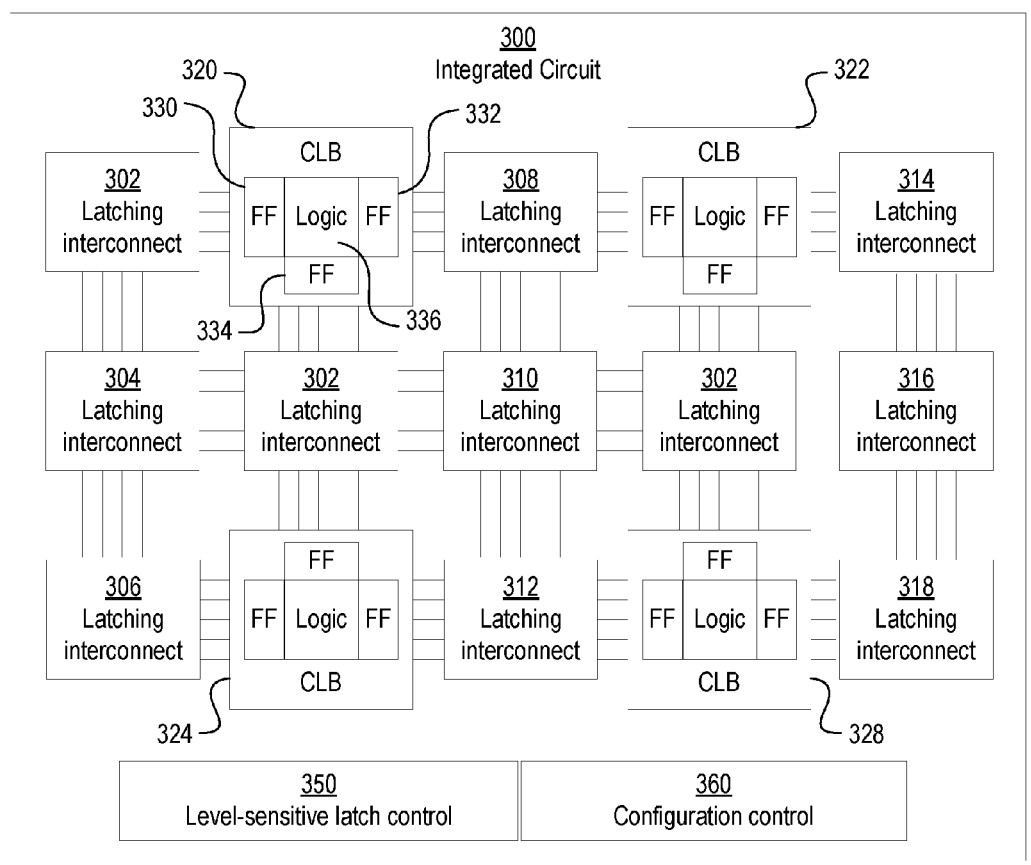
FIG. 3 shows an example integrated circuit having programmable latching interconnects configurable to prevent hold time violations on various programmable signal paths, consistent with one or more implementations.

FIG. 3 shows an example integrated circuit having programmable latching interconnects configurable to prevent hold time violations. The integrated circuit 300 includes a plurality of configurable logic blocks (CLBs) 320, 322, 324, and 328. In different implementations, the CLBs may include various logic circuits 336 including, for example, input/output blocks (IOBs), dedicated random access memory blocks (BRAMs), multipliers, digital signal processing blocks (DSPs), processors, clock managers, delay lock loops (DLLs), bus or network interfaces. In this example, configurable logic blocks 320, 322, 324, and 328 include flip-flop 330, 332 and 334 connecting inputs and or outputs of the logic circuits 336 to input or output nodes of the CLBs 320, 322, 324, and 328. The integrated circuit 300 also includes a set of programmable routing resources, a plurality of latching interconnects 302, 304, 306, 308, 310, 312, 314, 316, and 318. The latching interconnects may be configured by the configuration control circuit 360 to form signal paths specified by a set of configuration data. In an exemplary implementation, the latching interconnects may be implemented as multiplexer-based latch circuits, as described in the co-pending patent application Ser. No. 15/234,640, entitled, "MULTIMODE MULTIPLEXER-BASED CIRCUIT," by Ilya Ganusov et al. The co-pending patent application was filed on Aug. 11, 2016, is assigned to Xilinx, Inc., and is incorporated herein by reference in its entirety.

The programmable routing resources and configurable logic blocks are programmed by a configuration control circuit 360 according to the set of configuration data. The programmable routing resources and configurable logic blocks may be programmed, for example, by loading configuration data values into internal configuration memory cells that define how the CLBs and programmable logic circuits are configured. The collective states of the individual memory cells then determine the operation of the routing resources and configurable logic blocks. The configuration data can be read from memory (e.g., from an external PROM) or written into the integrated circuit 300 by an external device.

The signal paths provided by the latching interconnects include level-sensitive latches that may be used to remove hold time violations. The integrated circuit includes a level-sensitive latch control circuit 350 is configured to control pulse clocking of latches. As described with reference to FIGS. 1 and 2, the level-sensitive latch control circuit 350 is configured to prevent hold time violations by enabling clocking of the level sensitive latches in signal paths exhibiting hold time violations with a phase-shifted pulsed clock signal.

Signal paths exhibiting hold time violations may be specified, for example, in the set of configuration data provided to or retrieved by the integrated circuit 300. The level-sensitive latch control circuit 350 is configured to maintain latches in other signal paths in a transparent state (e.g. by providing a constant signal to the clock input of the other level-sensitive latches). In this manner, hold time violations in a placed and routed circuit design may be removed without modifying routing of signal paths. As a result, computing time and resources required to achieve a placed and routed circuit design that satisfies timing requirement may be reduced.

Figure 4:
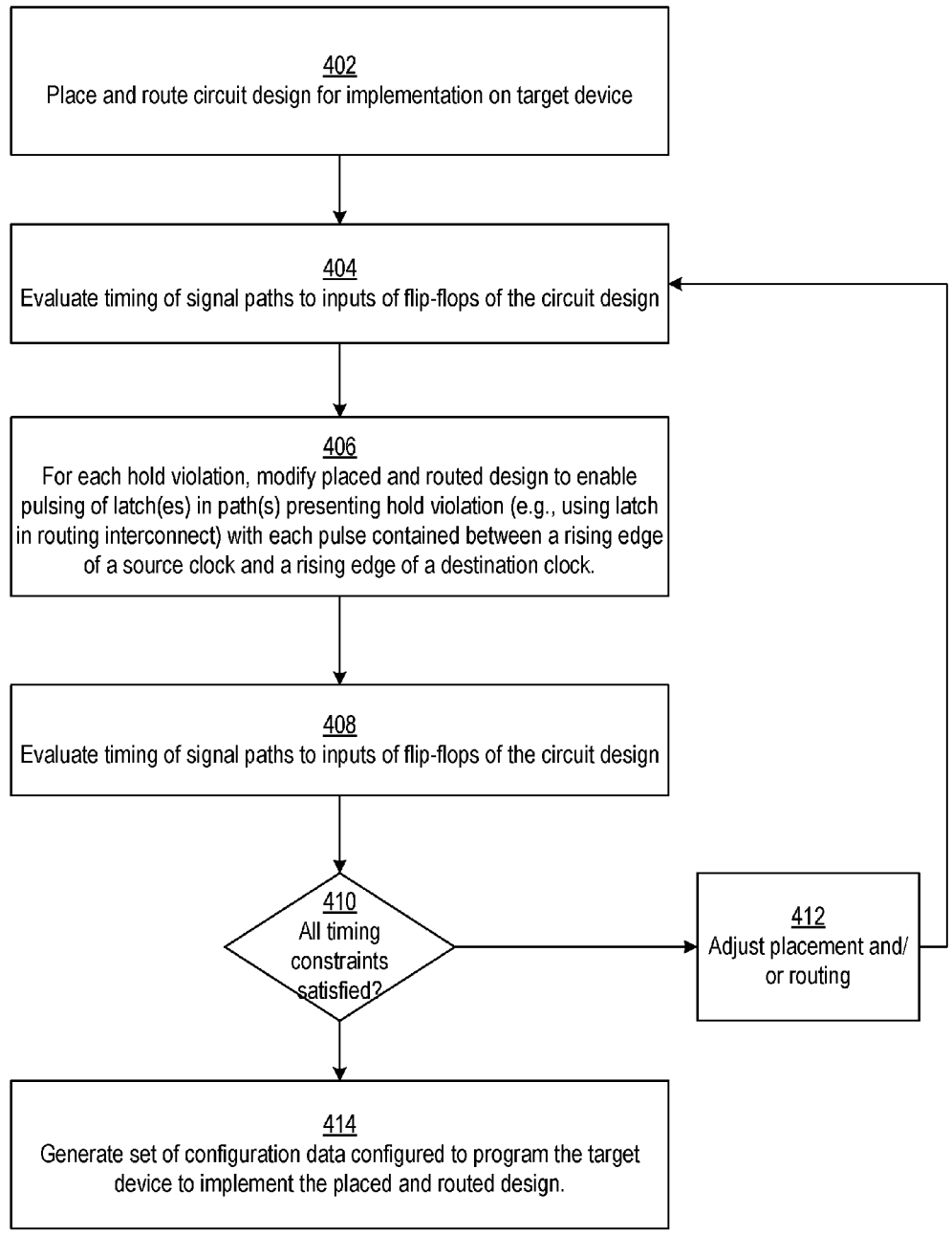
FIG. 4 shows an example process for removing hold time violations in a circuit design, consistent with one or more implementations.

FIG. 4 shows an example process for identification and removal of hold time violations in a circuit design, consistent with one or more implementations. At block 402, the circuit design is placed and routed for implementation on a target integrated circuit device. At block 404, timing of signal paths to inputs of flip-flops of the circuit design is evaluated to identify hold time violations (e.g., by simulating the placed and routed circuit design). For each identified hold time violation, the placed and routed design is modified at block 406 to enable pulsing of a level-sensitive latch in the signal path presenting the hold time violation. In some rare instances, it may not be possible to correct all hold time violations using only the pulsed latches discussed above. At block 408, timing is reanalyzed to determine if all hold time violations have been corrected. If all hold time violations are not corrected, the process proceeds from decision block 410 to block 412. At block 412, placement and/or routing of the circuit design is modified in an attempt to improve timing. The process returns back to block 404, where timing is reevaluated. The process repeats in this manner until all hold time violations have been corrected. Once all hold time violations are corrected, the process proceeds to block 414. At block 414, a set of configuration data is generated. The configuration data can be stored in a non-volatile memory and subsequently used to program the target device to implement the placed and routed circuit design.

Figure 5:
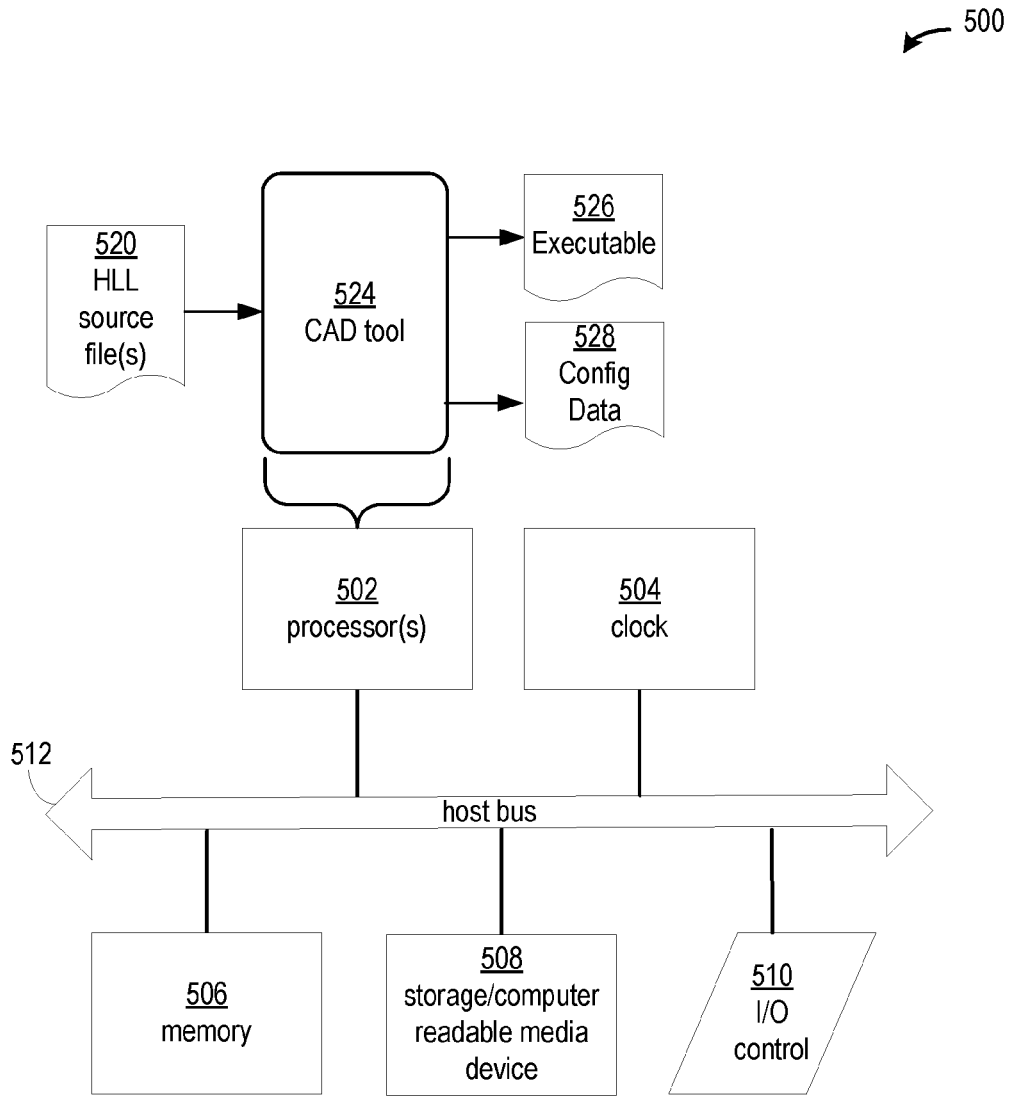
FIG. 5 shows an example computing system that may be used to adapt a circuit design to remove hold time violations and configure a programmable IC to implement the resulting circuit design, consistent with one or more implementations.

FIG. 5 shows an example computing system that may be used to adapt a circuit design to remove hold time violations and configure a programmable IC to implement the resulting circuit design, consistent with one or more implementations. It will be appreciated that various alternative computing arrangements, including one or more processors and a memory arrangement configured with program code, would be suitable for hosting the disclosed processes and data structures. The computer code, which implements the disclosed processes, is encoded in a processor executable format and may be stored and provided via a variety of computer-readable storage media or delivery channels such as magnetic or optical disks or tapes, electronic storage devices, or as application services over a network.

Processor computing arrangement 500 includes one or more processors 502, a clock signal generator 504, a memory arrangement 506, and an input/output control unit 510, all coupled to a host bus 512. The arrangement 500 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor(s) 502 may be one or more general purpose processors, or a combination of one or more general purpose processors and suitable co-processors, or one or more specialized processors (e.g., RISC, CISC, pipelined, etc.). The memory arrangement 506 typically includes multiple levels of cache memory, and a main memory. The memory arrangement 506 may include local and/or remote persistent storage, such as provided by magnetic disks (not shown), flash, EPROM, or other non-volatile data storage. The memory arrangement 506 may be read or read/write capable.

The processor(s) 502 executes the software in the memory arrangement 506, reads data from and stores data to the memory arrangement 508, and communicates with external devices through the input/output control arrangement 510. These functions are synchronized by the clock signal generator 504. The resources of the computing arrangement may be managed by either an operating system (not shown), or a hardware control unit (not shown).

In some implementations, the memory arrangement 506 stores a set of instructions that, when executed, cause the processor 502 to provide a CAD tool 524. The CAD tool 524 may provide a GUI configured to aid in the design, simulation, testing, placement and routing, and/or hold time correction of system designs, for example, as described with reference to FIGS. 1-4.

In some implementations, the CAD tool 524 may be configured to automatically compile an HLL source file 520 for implementation of a system design on a SOC. The CAD tool 524 may be configured to identify and determine subsets of function calls to hardware accelerated functions for implementation in programmable logic resources of the SOC. The CAD tool 524 generates or retrieves a hardware description language (HDL) circuit design for implementation of the hardware accelerated functions.

The CAD tool 524 places and routes the HDL circuit design and removes hold time violations, for example, as described with reference to the process shown in FIG. 5. The CAD tool 524 generates sets of programmable logic (PL) configuration data 528 for implementation of the resulting placed and routed circuit design. The CAD tool 524 may also supplement the HLL source file 520 with HLL code (e.g., interface code) to communicate data between HLL function calls and hardware accelerated functions implemented by the PL configuration data 528 The CAD tool compiles the supplemented HLL source file to produce an executable program 526 configured for execution on a processor of a SOC. The CAD tool 524 may package the executable 526 and PL configuration data 528 into one or more boot images for booting of the SOC.

Figure 6:
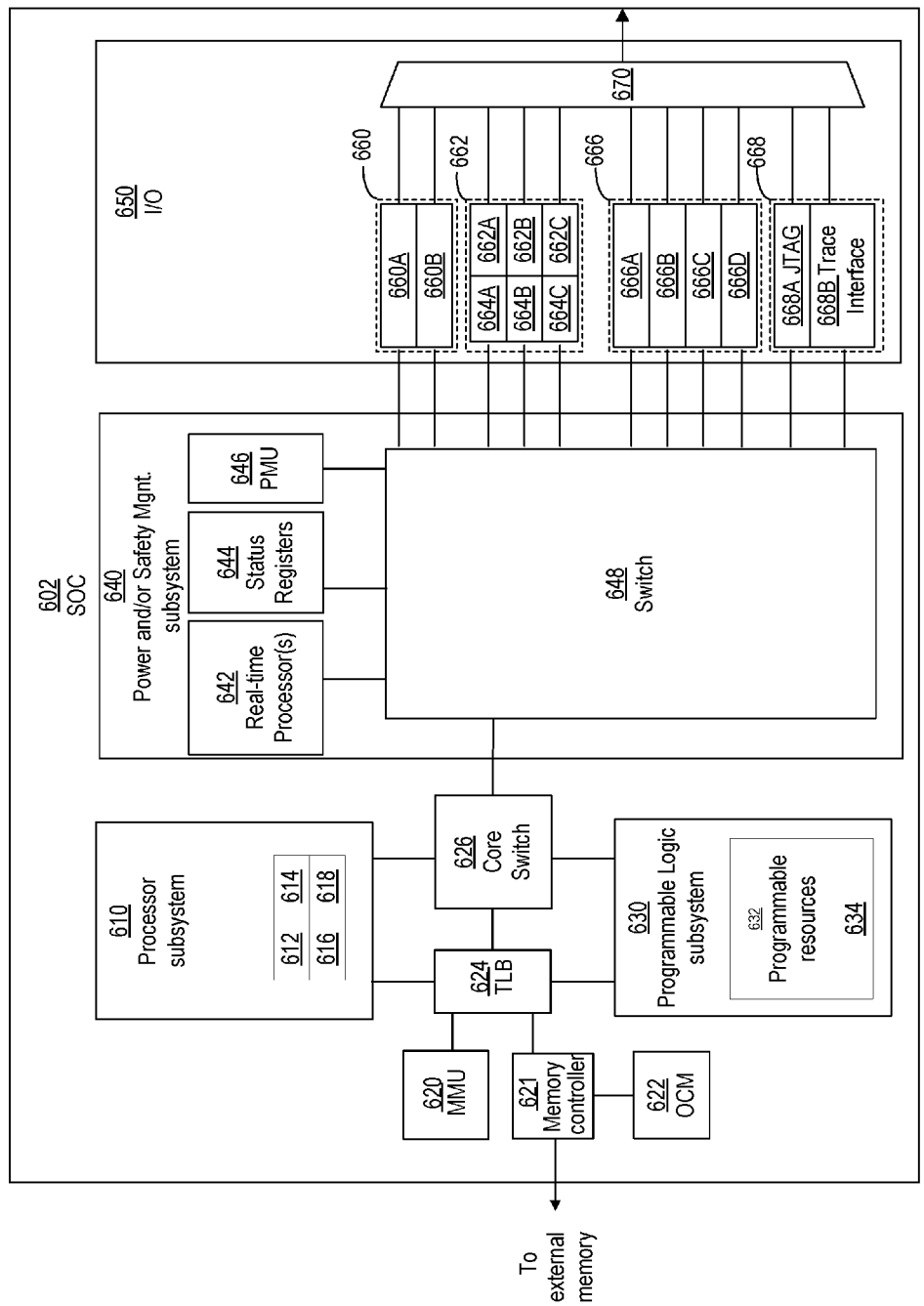
FIG. 6 shows an example programmable IC that may be adapted to include the disclosed configurable latch circuits, consistent with one or more implementations.

FIG. 6 shows an example programmable IC 602 that may be configured in accordance with one or more implementations. The programmable IC may also be referred to as a System On Chip (SOC), which includes a processor subsystem 610 and a programmable logic subsystem 630. The processor subsystem 610 may be programmed to implement a software portion of the user design, via execution of a user program. The program may be specified as part of a configuration data stream or may be retrieved from an on-chip or off-chip data storage device. The processor subsystem 610 may include various circuits 612, 614, 616, and 618 for executing one or more software programs. The circuits 612, 614, 616, and 618 may include, for example, one or more processor cores, floating point units (FPUs), an interrupt processing unit, on chip-memory, memory caches, and/or cache coherent interconnect.

The programmable logic subsystem 630 of the programmable IC 602 may be programmed to implement a hardware portion of a user design. For instance, the programmable logic subsystem may include a number of programmable resources 632, which may be programmed to implement a set of circuits specified in a configuration data stream. The programmable resources 632 include, for example, programmable interconnect circuits, programmable logic circuits, and configuration memory cells. The programmable logic implements the logic of a user design using programmable elements that can include, for example, function generators, registers, arithmetic logic, and so forth. Programmable interconnect circuits may include a large number of interconnect lines of varying lengths interconnected by programmable interconnect points (PIPs).

The programmable resources 632 may be programmed by loading a configuration data stream into the configuration memory cells, which define how the programmable interconnect circuits and programmable logic circuits are configured. For example, setting a configuration memory cell for a configurable latch to a first value may direct the configurable latch to operate as a single-edge-driven latch. Setting the configuration memory cell to a second value may direct the configurable latch to operate as a double-edge-driven latch. The collective states of the individual memory cells then determine the function of the programmable resources 632. The configuration data can be read from memory (e.g., from an external PROM) or written into the programmable IC 602 by an external device. In some implementations, a configuration controller 634 included in the programmable logic subsystem 630 may program the programmable resources, in response to powering on the programmable IC, by retrieving configuration data from a non-volatile memory coupled to the programmable IC and loading the configuration data into the configuration memory cells. In some other implementations, the configuration data may be loaded into the configuration memory cells by a start-up process executed by the processor subsystem 610.

The programmable IC 602 may include various circuits to interconnect the processor subsystem 610 with circuitry implemented within the programmable logic subsystem 630. In this example, the programmable IC 602 includes a core switch 626 that can route data signals between various data ports of the processor subsystem 610 and the programmable logic subsystem 630. The core switch 626 may also route data signals between either of the programmable logic or processing subsystems 610 and 630 and various other circuits of the programmable IC, such as an internal data bus. Alternatively or additionally, the processor subsystem 610 may include an interface to directly connect with the programmable logic subsystem—bypassing the core switch 626. Such an interface may be implemented, for example, using the AMBA AXI Protocol Specification (AXI) as published by ARM.

In some implementations, the processor subsystem 610 and the programmable logic subsystem 630 may also read or write to memory locations of an on-chip memory 622 or off-chip memory (not shown) via memory controller 621. The memory controller 621 can be implemented to communicate with one or more different types of memory circuits including, but not limited to, Dual Data Rate (DDR) 2, DDR3, Low Power (LP) DDR2 types of memory, whether 16-bit, 32-bit, 16-bit with ECC, etc. The list of different memory types with which memory controller 621 is able to communicate is provided for purposes of illustration only and is not intended as a limitation or to be exhaustive. As shown in FIG. 6, the programmable IC 602 may include a memory management unit 620 and translation look-aside buffer 624 to translate virtual memory addresses used by the subsystems 610 and 630 to physical memory addresses used by the memory controller 621 to access specific memory locations.

The programmable IC may include an input/output (I/O) subsystem 650 for communication of data with external circuits. The I/O subsystem 650 may include various types of I/O devices or interfaces including for example, flash memory type I/O devices, higher performance I/O devices, lower performance interfaces, debugging I/O devices, and/or RAM I/O devices.

The I/O subsystem 650 may include one or more flash memory interfaces 660 illustrated as 660A and 660B. For example, one or more of flash memory interfaces 660 can be implemented as a Quad-Serial Peripheral Interface (QSPI) configured for 4-bit communication. One or more of flash memory interfaces 660 can be implemented as a parallel 8-bit NOR/SRAM type of interface. One or more of flash memory interfaces 660 can be implemented as a NAND interface configured for 8-bit and/or 16-bit communication. It should be appreciated that the particular interfaces described are provided for purposes of illustration and not limitation. Other interfaces having different bit widths can be used.

The I/O subsystem 650 can include one or more interfaces 662 providing a higher level of performance than flash memory interfaces 660. Each of interfaces 662A-662C can be coupled to a DMA controller 664A-664C respectively. For example, one or more of interfaces 662 can be implemented as a Universal Serial Bus (USB) type of interface. One or more of interfaces 662 can be implemented as a gigabit Ethernet type of interface. One or more of interfaces 662 can be implemented as a Secure Digital (SD) type of interface.

The I/O subsystem 650 may also include one or more interfaces 666 such as interfaces 666A-666D that provide a lower level of performance than interfaces 662. For example, one or more of interfaces 666 can be implemented as a General Purpose I/O (GPIO) type of interface. One or more of interfaces 666 can be implemented as a Universal Asynchronous Receiver/Transmitter (UART) type of interface. One or more of interfaces 666 can be implemented in the form of a Serial Peripheral Interface (SPI) bus type of interface. One or more of interfaces 666 can be implemented in the form of a Controller-Area-Network (CAN) type of interface and/or an $I^2C$ type of interface. One or more of interfaces 666 also can be implemented in the form of a timer type of interface.

The I/O subsystem 650 can include one or more debug interfaces 668 such as processor JTAG (PJTAG) interface 668A and a trace interface 668B. PJTAG interface 668A can provide an external debug interface for the programmable IC 602. Trace interface 668B can provide a port to receive debug, e.g., trace, information from the processor subsystem 610 or the programmable logic subsystem 630.

As shown, each of interfaces 660, 662, 666, and 668 can be coupled to a multiplexer 670. Multiplexer 670 provides a plurality of outputs that can be directly routed or coupled to external pins of the programmable IC 602, e.g., balls of the package within which the programmable IC 602 is disposed. For example, I/O pins of programmable IC 602 can be shared among interfaces 660, 662, 666, and 668. A user can configure multiplexer 670, via a configuration data stream to select which of interfaces 660-668 are to be used and, therefore, coupled to I/O pins of programmable IC 602 via multiplexer 670. The I/O subsystem 650, may also include a fabric multiplexer I/O (FMIO) interface (not shown) to connect interfaces 662-668 to programmable logic circuits of the programmable logic subsystem. Additionally or alternatively, the programmable logic subsystem 630 can be configured to implement one or more I/O circuits within programmable logic. In some implementations, the programmable IC 602 may also include a subsystem 640 having various circuits for power and/or safety management. For example, the subsystem 640 may include a power management unit 646 configured to monitor and maintain one or more voltage domains used to power the various subsystems of the programmable IC 602. In some implementations, the power management unit 646 may disable power of individual subsystems, when idle, to reduce power consumption, without disabling power to subsystems in use.

The subsystem 640 may also include safety circuits to monitor the status of the subsystems to ensure correct operation. For instance, the subsystem 640 may include one or more real-time processors 642 configured to monitor the status of the various subsystems (e.g., as indicated in status registers 644). The real-time processors 642 may be configured to perform a number of tasks in response to detecting errors. For example, for some errors, the real-time processors 642 may generate an alert in response to detecting an error. As another example, the real-time processors 642 may reset a subsystem to attempt to restore the subsystem to correct operation. The subsystem 640 includes a switch network 648 that may be used to interconnect various subsystems. For example, the switch network 648 may be configured to connect the various subsystems 610, 630, and 640 to various interfaces of the I/O subsystem 650. In some applications, the switch network 648 may also be used to isolate the real-time processors 642 from the subsystems that are to be monitored. Such isolation may be required by certain application standards (e.g., IEC-61508 SIL3 or ISO-26262 standards) to ensure that the real-time processors 642 are not affected by errors that occur in other subsystems.

The methods and circuits are thought to be applicable to a variety of systems that utilize latching circuits. Other aspects and features will be apparent to those skilled in the art from consideration of the specification. For instance, although aspects and features may in some cases be described in individual figures, it will be appreciated that features from one figure can be combined with features of another figure even though the combination is not explicitly shown or explicitly described as a combination. The methods and systems may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A circuit, comprising:
a set of flip-flops including at least a first flip-flop configured to receive a first clock signal, a second flip-flop configured to receive a second clock signal, and a third flip-flop configured to receive the second clock signal;
a first level-sensitive latch connected in programmable routing resources of a first signal path from an output of the first flip-flop to an input of the second flip-flop;
a second level-sensitive latch connected in programmable routing resources of a second signal path from an output of the first flip-flop to an input of the third flip-flop and
a level-sensitive latch control circuit configured to:
provide a phase-shifted pulsed clock signal to a clock node of the level-sensitive latch and prevent a hold time violation resulting from a delay from the first flip-flop through the level-sensitive latch to the second flip-flop being less than a skew between the first clock signal and the second clock signal; and
provide a constant value to the clock node of the second level-sensitive latch to maintain the level-sensitive latch in a transparent state.

2. The circuit of claim 1, wherein, in each cycle of the second clock signal, the pulsed clock signal includes a pulse having a rising edge occurring after a rising edge of the second clock signal and having a falling edge occurring before a rising edge of the first clock signal.

3. The circuit of claim 1, wherein each cycle of the pulsed clock signal has a first portion having a first value and a second portion having a second value, and wherein a duration of the first portion is less than a duration of the second portion.

4. The circuit of claim 1, wherein the pulsed clock signal has a rising edge and a falling edge that cause the level-sensitive latch to latch a signal value output from the first flip-flop before a next cycle of the first clock signal.

5. The circuit of claim 1, wherein the pulsed clock signal is an inversion of the first clock signal.

6. The circuit of claim 1, wherein the first clock signal is out of phase with the second clock signal.

7. The circuit of claim 1, wherein:
propagation delay on the second signal path is longer than the propagation delay on the first signal path; and
delay between a rising edge of the first clock signal and a rising edge of the second clock signal prevents a setup violation on the second signal path for an input data signal to the third flip-flop based on the output from the one of the set of flip-flops.

8. The circuit of claim 1, wherein the level-sensitive latch is implemented by a multiplexer-based latch circuit.

9. An integrated circuit, comprising:
a set of programmable logic resources including a plurality of flip-flops;
a set of programmable routing resources including level-sensitive latches in respective programmable signal paths;
a configuration control circuit configured and arranged to, in response to receiving a set of configuration data, program the set of programmable logic resources and the set of programmable routing resources to implement the circuit based on a circuit design,
wherein the set of configuration data specifies a subset of the programmable signal paths;
a circuit including a first flip-flop of the plurality of flip-flops clocked by a first clock signal, a second flip-flop of the plurality of flip-flops clocked by a second clock signal, and one of the level-sensitive latches in a signal path connecting an output of the first flip-flop to the second flip-flop, wherein propagation delay from the first flip-flop through the level-sensitive latch to the second flip-flop is less than skew between the first clock signal and the second clock signal; and
a level-sensitive latch control circuit configured to:
prevent a hold time violation resulting from the propagation delay from the first flip-flop through the level-sensitive latch to the second flip-flop being less than the skew between the first clock signal and the second clock signal, by enabling clocking of the one of the level-sensitive latches with a phase-shifted pulsed clock signal;
provide the pulsed clock signal to the level-sensitive latch in each respective programmable signal path in the subset of the programmable signal paths, and
for each level-sensitive latch of the level-sensitive latches that is not in a respective programmable signal path of the subset of programmable signal paths, provide a constant value to a clock input of the level-sensitive latch to maintain the level-sensitive latch in a transparent state.

10. The integrated circuit of claim 9, wherein, in each cycle of the second clock signal, the pulsed clock signal includes a pulse having a rising edge after a rising edge of the second clock signal and having a falling edge before a rising edge of the first clock signal.

* * * * *